(12) United States Patent
Wang et al.

(10) Patent No.: US 10,872,829 B2
(45) Date of Patent: Dec. 22, 2020

(54) METHOD FOR REPAIRING A DISPLAY SUBSTRATE

(71) Applicants: HEFEI XINSHENG OPTOELECTRONICS TECHNOLOGY CO., LTD., Hefei (CN); BOE TECHNOLOGY GROUP CO., LTD., Beijing (CN)

(72) Inventors: Haitao Wang, Beijing (CN); Guangyao Li, Beijing (CN); Jun Wang, Beijing (CN); Qinghe Wang, Beijing (CN); Ning Liu, Beijing (CN); Dongfang Wang, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 16/427,771

(22) Filed: May 31, 2019

(65) Prior Publication Data

US 2020/0105627 A1   Apr. 2, 2020

(30) Foreign Application Priority Data

Sep. 28, 2018  (CN) .......................... 2018 1 1138641

(51) Int. Cl.
*H01L 21/00*   (2006.01)
*H01L 27/00*   (2006.01)
(Continued)

(52) U.S. Cl.
CPC ............ *H01L 22/22* (2013.01); *H01L 27/127* (2013.01); *H01L 27/1225* (2013.01); (Continued)

(58) Field of Classification Search
CPC ......... H01L 22/22; H01L 22/20; H01L 22/30; H01L 27/1244; H01L 27/127; (Continued)

(56) References Cited

U.S. PATENT DOCUMENTS 7,105,392 B2 * 9/2006 Isobe ................. H01L 27/12
257/59
7,148,092 B2 * 12/2006 Isobe ................. H01L 27/12
438/166

(Continued)

*Primary Examiner* — Nikolay K Yushin
(74) *Attorney, Agent, or Firm* — Nath, Goldberg & Meyer; Joshua B. Goldberg

(57) ABSTRACT

A thin film transistor, a display substrate and a method for repairing the same, and a display device are provided. The thin film transistor includes: an active region, a gate insulating layer disposed on a side of the active region, and a gate disposed on a side of the gate insulating layer distal to the active region, and the active region includes a first electrode contact region at one end of the active region, a second electrode contact region at the other end of the active region, and a plurality of connection regions between the first electrode contact region and the second electrode contact region, and each of the plurality of connection regions is coupled to the first electrode contact region and the second electrode contact region, and every two adjacent connection regions are provided with an opening therebetween and are spaced apart from each other by the opening.

9 Claims, 6 Drawing Sheets

--- locating, in the at least part of the plurality of thin film transistors in the display substrate, a thin film transistor of which the gate and at least one of the plurality of connection regions are short-circuited disconnecting the at least one of the plurality connection regions of the thin film transistor from the first contact region and second contact region of the thin film transistor

(51) Int. Cl.
    *H01L 29/00*      (2006.01)
    *H01L 21/66*      (2006.01)
    *H01L 27/12*      (2006.01)
    *H01L 29/24*      (2006.01)
    *H01L 29/417*      (2006.01)
    *H01L 29/66*      (2006.01)
    *H01L 29/786*      (2006.01)

(52) U.S. Cl.
    CPC .......... *H01L 27/1244* (2013.01); *H01L 29/24* (2013.01); *H01L 29/41733* (2013.01); *H01L 29/66969* (2013.01); *H01L 29/7869* (2013.01)

(58) Field of Classification Search
    CPC ........... H01L 27/1225; H01L 29/41733; H01L 29/66969; H01L 29/7869; H01L 29/24; G02F 1/1309; G02F 1/1368; G02F 1/133502; G02F 1/133526; G02F 1/133603; G09G 3/006; G09G 3/3225; G09G 3/3333; G09G 3/3383; G09G 3/32; G09G 3/00
    See application file for complete search history.

(56) References Cited

U.S. PATENT DOCUMENTS

| | | | |
|---|---|---|---|
| 8,299,461 B2* | 10/2012 | Tanaka | H01L 21/02554 257/43 |
| 2003/0141505 A1* | 7/2003 | Isobe | H01L 27/12 257/66 |
| 2003/0141521 A1* | 7/2003 | Isobe | H01L 27/12 257/200 |
| 2010/0314618 A1* | 12/2010 | Tanaka | H01L 21/02554 257/43 |

* cited by examiner locating, in the at least part of the plurality of thin film transistors in the display substrate, a thin film transistor of which the gate and at least one of the plurality of connection regions are short-circuited

disconnecting the at least one of the plurality connection regions of the thin film transistor from the first contact region and second contact region of the thin film transistor

Fig. 6

METHOD FOR REPAIRING A DISPLAY SUBSTRATE

CROSS-REFERENCE TO RELATED APPLICATION

The present application claims the priority to the Chinese Patent Application No. 201811138641.8, filed on Sep. 28, 2018, the disclosure of which is hereby incorporated in its entirety by reference.

TECHNICAL FIELD

The present disclosure relates to the field of display technology, and more particularly, to a thin film transistor, a display substrate, a method for repairing a display substrate, and a display device.

BACKGROUND

In a display substrate, generally, thin film transistors are included to form a driving circuit, and each of the thin film transistors includes an active region, a gate insulating layer, a gate, a source, and a drain. When impurity particles exist between the active region and the gate insulating layer, or the gate insulating layer has defects, a short circuit will be caused between the active region and the gate of the thin film transistor, and a display line defect (which is also called Data Gate Short (DGS) type of line defect in engineering) will occur since the gate is generally coupled to one gate line, which controls all transistors in a same row (that is, one gate line controls the entire row of sub-pixels). A design for repairing the display panel still needs to be improved.

SUMMARY

The present disclosure provides a thin film transistor, a display substrate and a repairing method thereof, and a display device.

According to a first aspect of the present disclosure, a thin film transistor is provided, which includes: an active region, a gate insulating layer disposed on a side of the active region, and a gate disposed on a side of the gate insulating layer distal to the active region, and the active region includes a first electrode contact region at one end of the active region, a second electrode contact region at the other end of the active region opposite to the first electrode contact region, and a plurality of connection regions between the first electrode contact region and the second electrode contact region, and each of the plurality of connection regions is coupled to the first electrode contact region and the second electrode contact region, and every two adjacent connection regions of the plurality of connection regions are provided with an opening therebetween, and are spaced apart from each other by the opening.

In some embodiments, the active region is disposed on a substrate; and the gate insulating layer is disposed on a side of the active region distal to the substrate, or on a side of the active region proximal to the substrate.

In some embodiments, the number of the plurality of connection regions ranges from 2 to 4.

In some embodiments, in a direction perpendicular to a direction that the first electrode contact region is directed to the second electrode contact region, each of the plurality of connection regions has a size ranging from 4 μm to 8 μm, and each opening has a size ranging from 6 μm to 10 μm.

In some embodiments, the opening is filled with an insulating material.

In some embodiments, the active region is formed of an oxide semiconductor.

In some embodiments, the active region is formed of an IGZO material.

According to a second aspect of the present disclosure, a display substrate is provided, and includes a plurality of thin film transistors disposed on a substrate, and each of at least part of the plurality of thin film transistors is the thin film transistors according to the first aspect of the present disclosure.

In some embodiments, the at least part of the plurality of thin film transistors are arranged in an array, the display substrate further includes a plurality of gate lines extending in a row direction, and among the at least part of the plurality of thin film transistors, gates of the thin film transistors in a same row are coupled to a same gate line.

In some embodiments, the gate insulating layer of each thin film transistor of the at least part of the plurality of thin film transistors is disposed on a side of the active region of the thin film transistor distal to the substrate, each of the plurality of gate lines covers the plurality of connection regions of each of the thin film transistors in the same row, among the at least part of the plurality of thin film transistors, and the gate of each thin film transistor of the at least part of the plurality of thin film transistors is formed by a portion of the gate line covering the plurality of connection regions of the thin film transistor.

In some embodiments, the gate insulating layer of each thin film transistor of the at least part of the plurality of thin film transistors is disposed on a side of the active region of the thin film transistor proximal to the substrate.

In some embodiments, the number of the plurality of connection regions ranges from 2 to 4.

In some embodiments, in a direction perpendicular to a direction that the first electrode contact region is directed to the second electrode contact region, each of the plurality of connection regions has a size ranging from 4 μm to 8 μm, and each opening has a size ranging from 6 μm to 10 μm.

In some embodiments, the opening is filled with an insulating material.

In some embodiments, the active region is formed of an oxide semiconductor.

According to a third aspect of the present disclosure, a display device is provided, which includes the display substrate according to the second aspect of the present disclosure, and a counter substrate.

According to a fourth aspect of the present disclosure, a method for repairing the display substrate according to the second aspect of the present disclosure is provided, and includes the following steps: locating, in the at least part of the plurality of thin film transistors in the display substrate, a thin film transistor of which the gate and at least one of the plurality of connection regions are short-circuited, and disconnecting the at least one of the plurality connection regions of the thin film transistor from the first contact region and the second contact region of the thin film transistor.

According to a fifth aspect of the present disclosure, a method for manufacturing the display substrate according to a second aspect of the present disclosure is provided, and includes the following steps: forming a buffer layer on a substrate and forming an active layer on the buffer layer, patterning the active layer such that the active layer includes the first contact region, the second contact region, and the plurality of connection regions, each of the plurality of connection regions is coupled to the first electrode contact region and the second electrode contact region, and every two adjacent ones of the plurality of connection regions are provided with an opening therebetween, and are spaced apart from each other by the opening; forming a gate insulating layer on the patterned active layer and forming a gate and a gate line on the gate insulating layer, forming an interlayer dielectric layer on the buffer layer with the gate and the gate line, and forming two via holes in the interlayer insulating layer, the two via holes extending to the first electrode contact region and the second electrode contact region of the active layer, respectively; forming a first electrode line and a second electrode line in the two via holes, respectively.

In some embodiments, the gate and the gate line are integrally formed.

In some embodiments, the gate and the gate line are integrally formed. In some embodiments, the number of the plurality of connection regions ranges from 2 to 4.

BRIEF DESCRIPTION OF THE FIGURES

FIG. 6 is a flowchart illustrating a method for repairing the display substrate according to some embodiments of the present disclosure.

DETAILED DESCRIPTION

Figure 1:
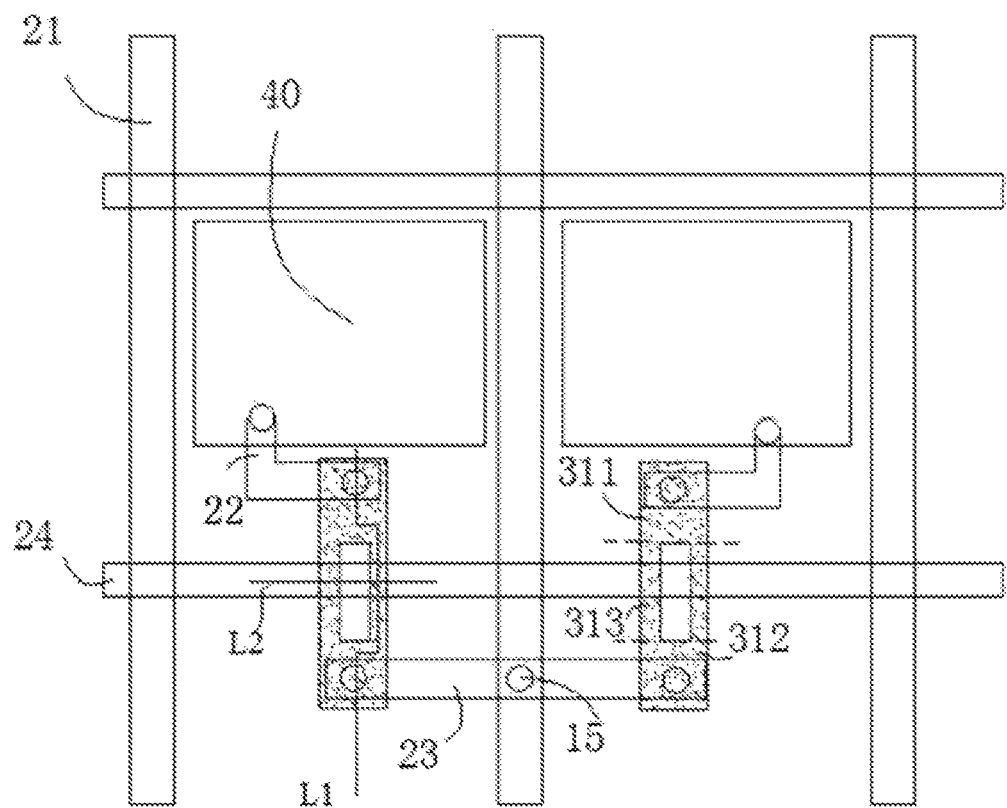
FIG. 1 is a top perspective view of a display substrate according to some embodiments of the present disclosure.

The present disclosure will be further described in detail below in combination with the drawings and embodiments to make a person skilled in the art better understand the technical solutions of the present disclosure In the present disclosure, "patterning process" refers to a step of forming a structure having a specific pattern, and may be a photolithography process including one or more steps of forming a material layer, coating photoresist, exposing, developing, etching, and stripping photoresist. Obviously, the "patterning process" may also be any other process such as an imprint process, an ink-jet printing process, and the like.

The present disclosure provides a thin film transistor that can be applied within a display substrate and involved to forming a driving circuit of, for example, a pixel electrode 40 (or other light emitting device). Referring to FIGS. 1 to 4, the thin film transistor includes an active region, a gate insulating layer 32 stacked on one side of the active region, and a gate 33 disposed on a side of the gate insulating layer 32 distal to the active region. The active region includes a first electrode contact region 311 on one end of the active region, a second electrode contact region 312 on the other end of the active region opposite to the first electrode contact region 311, and a plurality of connection regions 313 connecting the first electrode contact region 311 and the second electrode contact region 312 (boundaries between the first electrode contact region 311 and the connection region 313, and boundaries between the connection region 313 and the second electrode contact region 312 are indicated by broken lines in FIG. 1). Every two adjacent connection regions 313 are provided with a opening therebetween.

The first electrode contact region 311 of the active region is coupled to a first electrode line 22 to form a first electrode (i.e., one of the source and the drain of the thin film transistor, depending on a specific circuit structure). The second electrode contact region 312 of the active region is coupled to a second electrode line 23 to form a second electrode of the thin film transistor (i.e., the other one of the drain and the source, depending on the specific circuit structure). The thin film transistor of FIG. 1 has two connection regions 313, and the thin film transistor of FIG. 2 has three connection regions 313. A plurality of connection regions 313 spaced apart from each other may be used to form a plurality of channels, i.e., a plurality of current paths from the first electrode to the second electrode of the thin film transistor.

Figure 4:
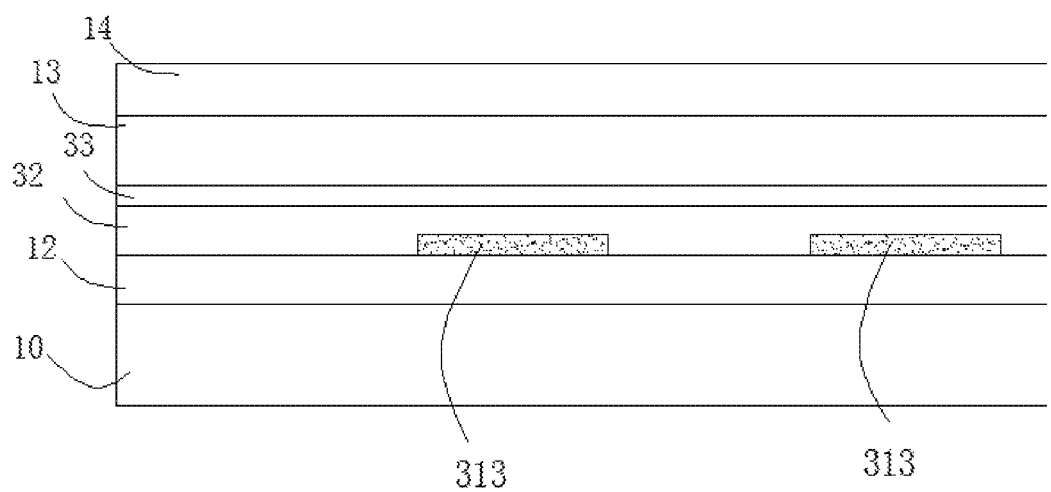
FIG. 4 is a cross-sectional view of the display substrate taken along line "L2" shown in FIG. 1.

In some embodiments, the opening is filled with an insulating material and for example, as shown in FIG. 4, adjacent connection regions 313 are spaced from each other by the gate insulating layer 32.

Figure 2:
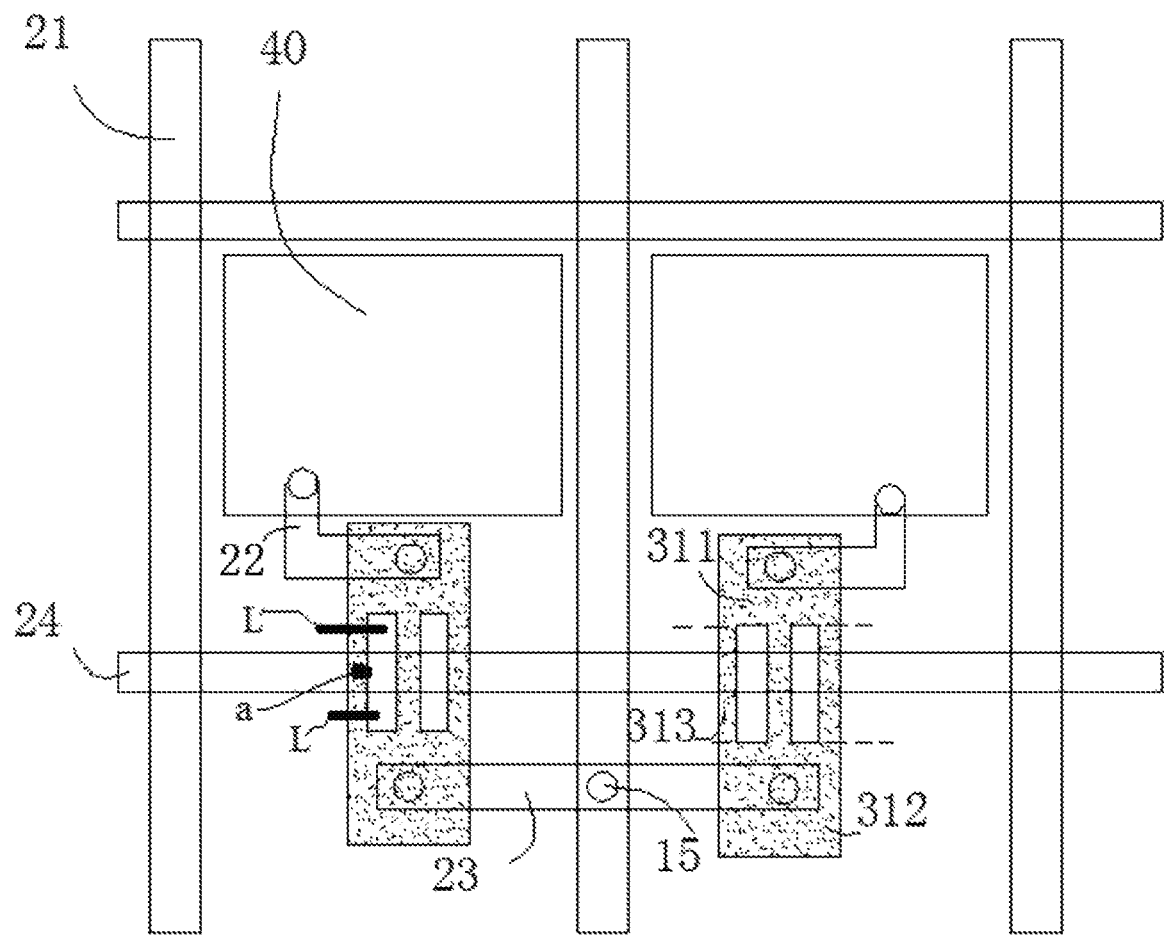
FIG. 2 is a top perspective view illustrating a display substrate according to some embodiments of the present disclosure.

Referring to FIG. 2, when one of the connection regions 313 and the gate 33 are short-circuited due to an impurity particle "a", a defect in the gate insulating layer 32 or the like, the connection of the connection region 313 with the source and the drain are cut off by a repairing method such as cutting the connection along the cutting lines L by a laser. Thus, the thin film transistor can keep working, avoiding display line defects. Even if the performance of the thin film transistor is affected to some extent, serious display point defect will not occur. By this way, the failure rate of the display substrate can be reduced.

Figure 3:
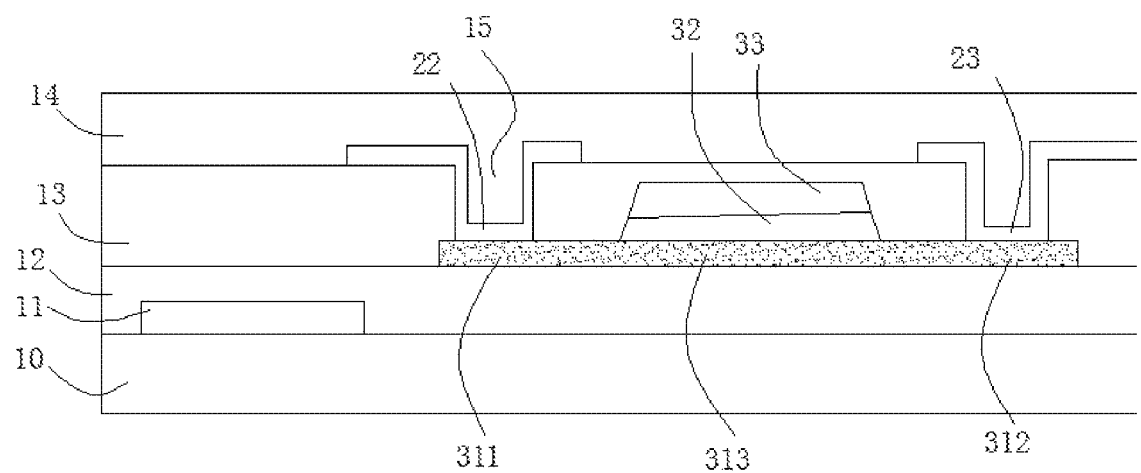
FIG. 3 is a cross-sectional view of the display substrate taken along line "L1" shown in FIG. 1.

In some embodiments, as shown in FIG. 3, the thin film transistor is disposed on the substrate 10. The gate insulating layer 32 is disposed on a side of the active region distal to the substrate 10. That is, the thin film transistor may have a top gate structure. Obviously, the gate insulating layer 32 may also be disposed on a side of the active region proximal to the substrate 10. That is, the present disclosure is equally applicable to a bottom gate structure.

In some embodiments, the active region is formed of an oxide semiconductor. Relatively speaking, an active region composed of an oxide semiconductor is more susceptible to the above-described defects. This kind of defect is more likely to occur when the active region is formed of an IGZO (indium gallium zinc oxide) material. Therefore, the improvement by the present disclosure is more effective for the thin film transistor in which the active region is formed by the IGZO material.

In some embodiments, the number of connection regions 313 ranges from 2 to 4.

In view of the fact that device area of each thin film transistor is limited, too many connection regions 313 may cause each connection region 313 to be too thin or cause the opening between adjacent connection regions 313 to be too small, then an impurity particle may affect a plurality of connection regions 313, which has the same influence as one connection region 313 affected by one impurity particle, but raises the requirement for the minimum line width of the semiconductor process. Thus, the number of connection regions 313 need not be excessive.

In some embodiments, in a direction perpendicular to a direction in which the first electrode contact region 311 is directed to the second electrode contact region 312, each of the connection regions 313 has a size ranging from 4 µm to 8 µm and each of the openings has a size ranging from 6 µm to 10 µm.

The above sizes are more effective for eliminating the above-mentioned defects in view of a size of the common impurity particle in the actual preparation process and a scale of the defect in the gate insulating layer 32.

The present disclosure provides a display substrate, referring to FIGS. 1-4, including a plurality of thin film transistors disposed on a substrate 10, and the thin film transistors are provided in accordance with the embodiments of the present disclosure.

In some embodiments, the plurality of thin film transistors are arranged in an array, and the display substrate further includes: a plurality of gate lines 24 extending in the row direction. The gates 33 of the thin film transistors of the same row in the array are coupled to a same gate line 24.

That is, the gates 33 of the above thin film transistors of the same row are controlled by a gate control voltage supplied from the same gate line 24.

A pixel electrode 40 in FIGS. 1 and 2 corresponds to a thin film transistor. The display substrate further includes a plurality of data lines 21 extending in the column direction, and the second electrode contact regions 312 of the thin film transistors of the same column are coupled to a same data line 21 through respective second electrode lines 23.

Obviously, there may be a plurality of thin film transistors corresponding to a pixel electrode 40, some of the thin film transistors are coupled to the gate line 24, and some of the thin film transistors are coupled to the data line 21. The thin film transistor provided by the embodiment of the present disclosure can be used regardless of the connection relationship between the thin film transistor and the gate line 24/the data line 21 in the display substrate.

In some embodiments, the gate insulating layer 32 is disposed on a side of the active region distal to the substrate 10, as shown in FIGS. 1 and 2, and one gate line 24 covers connection regions 313 of a plurality of thin film transistors in the same row. The gate 33 of the thin film transistor is formed by a portion of the gate line 24 covering the connection region 313 of the thin film transistor.

In some embodiments, the gate line 24 and the gate 33 are integrally formed, and a part of the gate line 24 also serves as the gate 33 of the thin film transistor.

The present disclosure provides a display device including a display substrate provided in accordance with an embodiment of the present disclosure.

Specifically, the display device may be any product or component having display function such as a liquid crystal display panel, an OLED (organic light emitting diode) display panel, an electronic paper, a mobile phone, a tablet computer, a television, a display, a notebook computer, a digital photo frame, a navigator, or the like.

The present disclosure provides a method for repairing a display substrate, which can be applied to the display substrate provided by an embodiment of the present disclosure, and a method for manufacturing the display substrate. The method includes locating, in the display substrate, a thin film transistor of which the gate 33 and the connection region 313 are short-circuited; and disconnecting the connection region 313 of the thin film transistor from the first contact region 311 and second contact region 312 of the thin film transistor.

Figure 5:
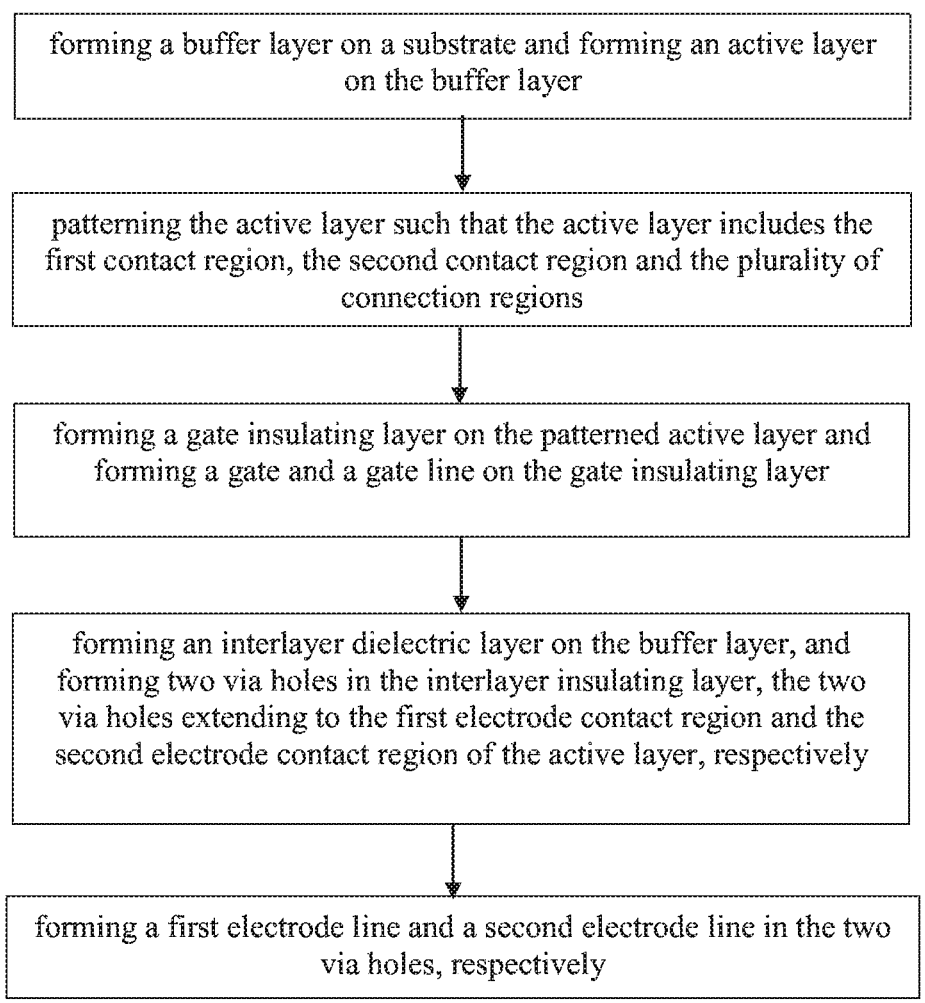
FIG. 5 is a flowchart illustrating a method of manufacturing the display substrate according to some embodiments of the present disclosure.

Taking FIG. 1 as an example, the method for manufacturing the display substrate and the method for repairing the display substrate are shown in FIG. 5 and FIG. 6, respectively, and include the following steps 1 to 8.

At step 1, a pattern of a metal light shielding layer 11 is formed on the substrate 10 (for example, a glass substrate) by a patterning process, after which the buffer layer 12 is deposited on the substrate 10. It should be noted that the pattern of the metal light shielding layer 11 may be designed according to actual requirements. The thin film transistor protected by the metal light shielding layer 11 in FIG. 3 is not shown.

At step 2, a material for forming an active region, such as IGZO, is deposited with a thickness ranging from 400 Å to 2000 Å, and then a photoresist is coating with a thickness ranged from 15,000 Å to 20,000 Å.

At step 3, the photoresist is exposed by a mask to form the active region with the shape the same as that of the active region according to an embodiment of the present disclosure, and then an etch process is performed on the material for forming the active region (such as IGZO) and the photoresist is then stripped off to form a plurality of connecting strips spaced apart from each other in the active region.

At step 4, a pattern of the gate insulating layer 32 (GI) is formed by a patterning process, and patterns of the gate 33 and the gate line 24 are formed by a patterning process. It is also possible to form the patterns of the insulating layer 32, the gate 33, and the gate line 24 by a single mask using a gray scale mask or the like.

At step 5, a pattern of an interlayer dielectric layer (IDL) 13 is formed by a patterning process with the via holes 15 which pass through the interlayer dielectric layer to extend to the first contact regions 311 and the second contact regions 312 of the active region.

At step 6, patterns of the first electrode line 22 and the second electrode line 23 are formed by a patterning process.

At step 7, a DGS type of line defect is located, and the connection region 313 having the defect is disconnected from the corresponding first contact regions 311 and the corresponding second contact regions 312 by a laser, for example as shown in FIG. 2.

At step 8, a passivation layer 14 (PVX) is deposited.

Further steps may be performed as in a related art. For example, forming a pattern of a color film, forming a pattern of the passivation layer 14, forming a pixel electrode 40 by a patterning process, and the like may be performed thereafter.

It should be understood that the foregoing embodiments are merely exemplary embodiments used for describing the principle of the present disclosure, but the present disclosure is not limited thereto. Those skilled in the art may make various variations and improvements without departing from the spirit and essence of the present disclosure, and these variations and improvements also fall into the protection scope of the present disclosure.

What is claimed is:

1. A method for repairing a display substrate, wherein the display substrate comprises a plurality of thin film transistors disposed on a substrate, each of at least part of the plurality of thin film transistors comprises:
   an active region,
   a gate insulating layer disposed on a side of the active region, and
   a gate disposed on a side of the gate insulating layer distal to the active region,
   wherein the active region comprises a first electrode contact region at one end of the active region, a second electrode contact region at the other end of the active region opposite to the first electrode contact region, and a plurality of connection regions between the first electrode contact region and the second electrode contact region, and each of the plurality of connection regions is coupled to the first electrode contact region and the second electrode contact region, and every two adjacent connection regions of the plurality of connection regions are provided with an opening therebetween, and are spaced apart from each other by the opening, and the method comprises:

locating, in the at least part of the plurality of thin film transistors in the display substrate, a thin film transistor of which the gate and at least one of the plurality of connection regions are short-circuited, and disconnecting the at least one of the plurality connection regions of the thin film transistor from the first contact region and the second contact region of the thin film transistor.

2. The method of claim 1, wherein the at least part of the plurality of thin film transistors are arranged in an array, the display substrate further comprises a plurality of gate lines extending in a row direction, and among the at least part of the plurality of thin film transistors, gates of the thin film transistors in a same row are coupled to a same gate line.

3. The method of claim 1, wherein, the gate insulating layer of each thin film transistor of the at least part of the plurality of thin film transistors is disposed on a side of the active region of the thin film transistor distal to the substrate, each of the plurality of gate lines covers the plurality of connection regions of each of the thin film transistors in the same row, among the at least part of the plurality of thin film transistors, and the gate of each thin film transistor of the at least part of the plurality of thin film transistors is formed by a portion of the gate line covering the plurality of connection regions of the thin film transistor.

4. The method of claim 1, wherein the gate insulating layer of each thin film transistor of the at least part of the plurality of thin film transistors is disposed on a side of the active region of the thin film transistor proximal to the substrate.

5. The method of claim 1, wherein the number of the plurality of connection regions ranges from 2 to 4.

6. The method of claim 1, wherein, in a direction perpendicular to a direction that the first electrode contact region is directed to the second electrode contact region, each of the plurality of connection regions has a size ranging from 4 μm to 8 μm, and each opening has a size ranging from 6 μm to 10 μm.

7. The method of claim 1, wherein the opening is filled with an insulating material.

8. The method of claim 1, wherein the active region is formed of an oxide semiconductor.

9. The method of claim 8, wherein the active region is formed of an IGZO material.

\* \* \* \* \*